United States Patent [19]

Nakatani et al.

[11] Patent Number: 5,296,937
[45] Date of Patent: Mar. 22, 1994

[54] IMAGE PROCESSING APPARATUS USING RECURSIVE FILTERS

[75] Inventors: Yoshinori Nakatani, Ootawara; Michitaka Honda, Yaita, both of Japan

[73] Assignee: Kabushiki Kaisha Toshiba, Kawasaki, Japan

[21] Appl. No.: 883,389

[22] Filed: May 15, 1992

[30] Foreign Application Priority Data

May 17, 1991 [JP] Japan .................................. 3-112073

[51] Int. Cl.$^5$ .............................................. H05G 1/64
[52] U.S. Cl. .................................. 358/448; 378/98.12
[58] Field of Search ............... 358/448, 443, 447, 463, 358/166, 167, 111; 382/56

[56] References Cited

U.S. PATENT DOCUMENTS

| | | | |
|---|---|---|---|
| 4,677,478 | 6/1987 | Kruger et al. | 358/111 |
| 5,016,104 | 5/1991 | Lim | 358/463 |
| 5,018,179 | 5/1991 | Kaneko | 358/111 |
| 5,051,842 | 9/1991 | Shimazaki | 358/463 |

*Primary Examiner*—Stephen Brinich
*Attorney, Agent, or Firm*—Oblon, Spivak, McClelland, Maier & Neustadt

[57] ABSTRACT

In a diagnostic X-ray apparatus, an image signal output from a TV camera connected to an image intensifier tube is supplied to a noise reducer through an A/D converter. The noise reducer comprises a first recursive filter for adding a value which is (1−a) times the input to the noise reducer and a value which is a times an output of the first recursive filter (a factor a is fixed to a value close to 1), a second recursive filter for adding a value which is (1−k) times the output of said fluoroscopy means and a value which is k times the output of the first recursive filter, a subtracter for subtracting the output of the second recursive filter from the input to the noise filter for every pixel, and a factor table for setting the factor k of the second recursive filter in accordance with the difference obtained by the subtracter such that the factor k and the difference have an inverse proportional relationship if the difference has a positive value.

17 Claims, 9 Drawing Sheets

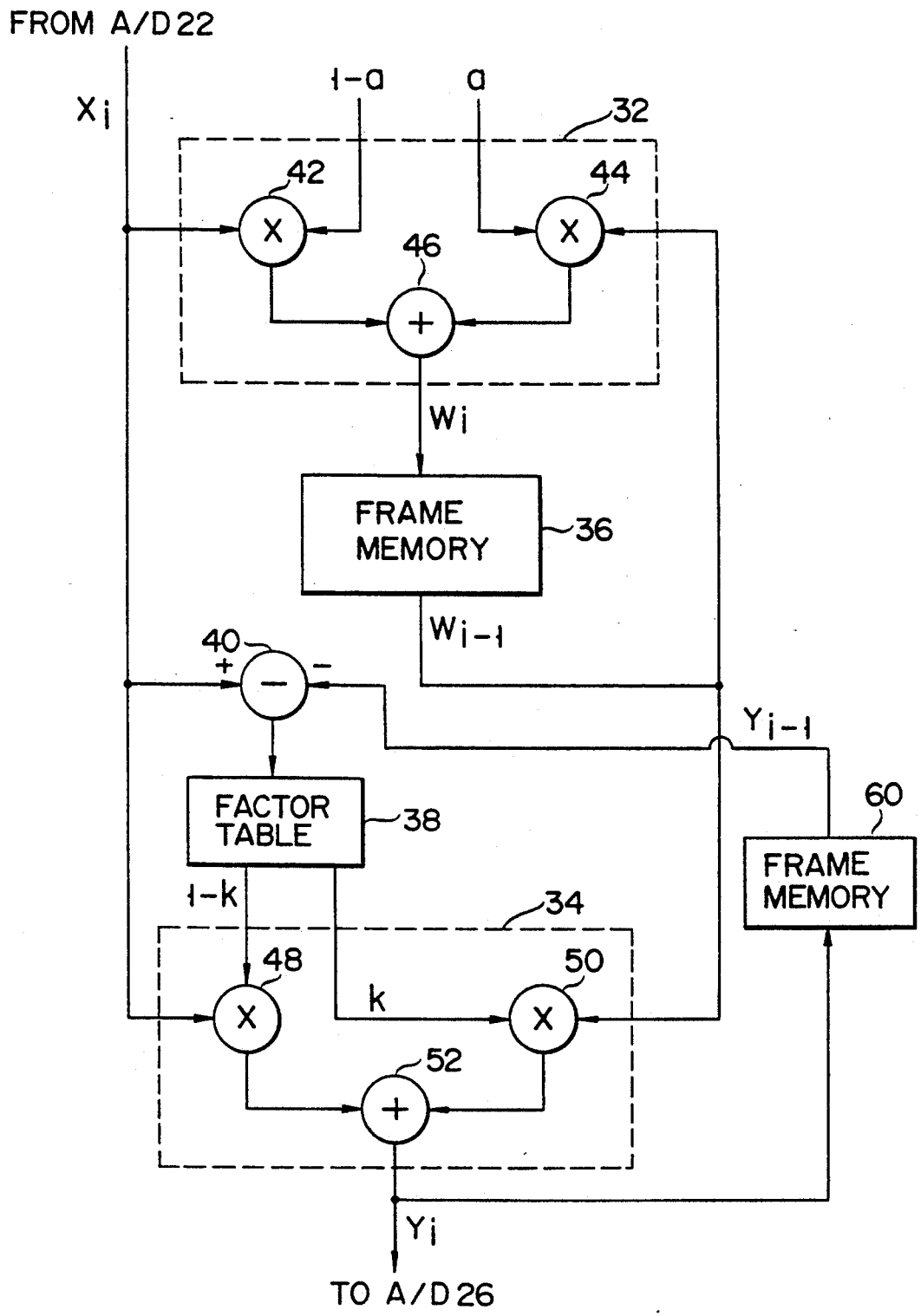
F I G. 3

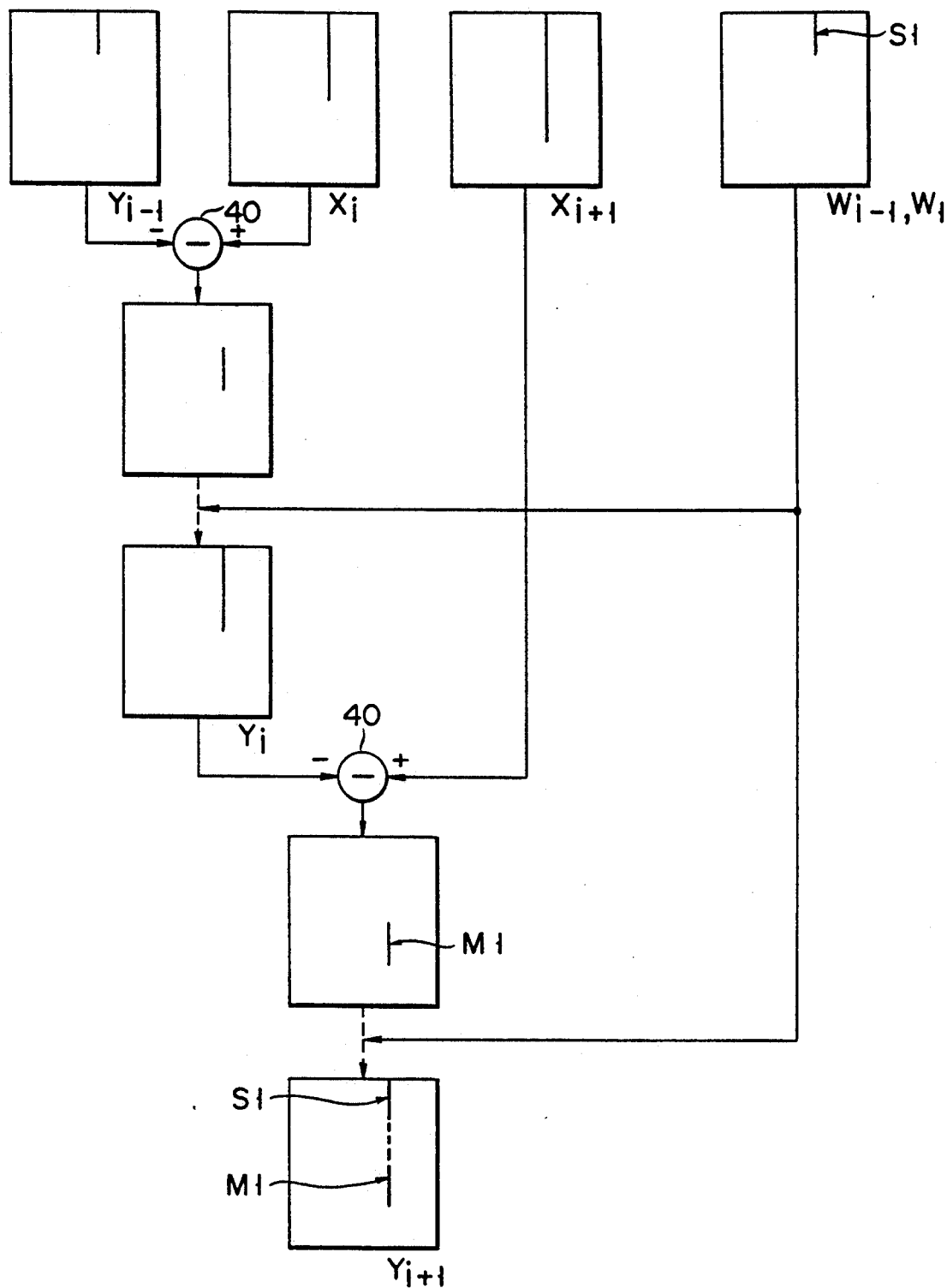
F I G. 9

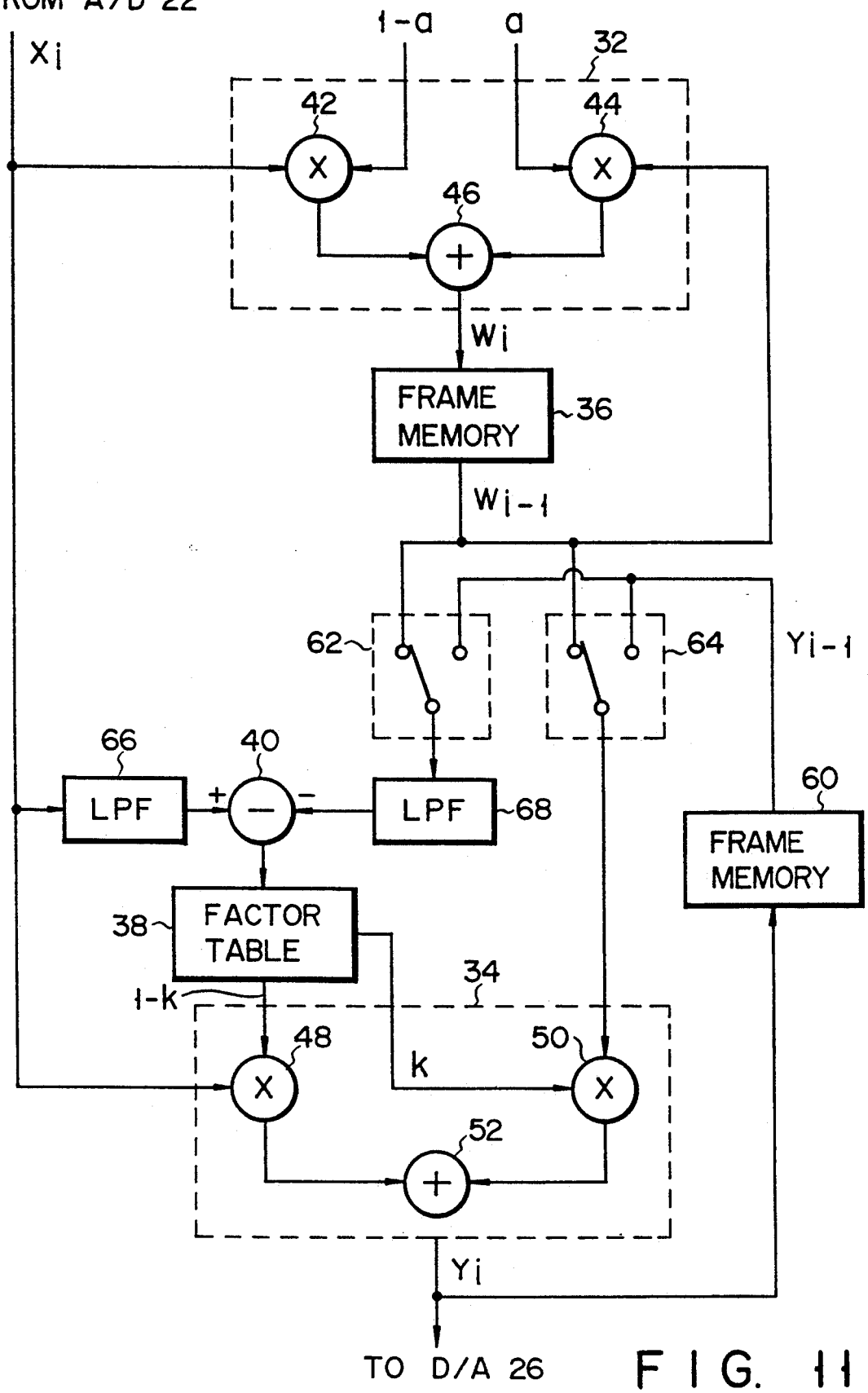
F I G. 11

IMAGE PROCESSING APPARATUS USING RECURSIVE FILTERS

BACKGROUND OF THE INVENTION

1. Field of the Invention

The present invention relates to an image processing apparatus for reducing random noises of an image by using a recursive filter.

2. Description of the Related Art

A recursive filter represented as follows is known as one example of noise reducers for reducing the random noises of a digital image.

$$Y_i = a \cdot Y_{i-1} + (1-a) \cdot X_i \quad (1)$$

where $Y_i$ is a filtered output of a present frame, $Y_{i-1}$ is a filtered output of the last frame, $X_i$ is a live image (an input to the filter) of the present frame, and a is a filter factor.

Thus, the recursive filter reduces the random noise by adding the product of the live image $X_i$ and the filter factor a to the product of the filtered output image $Y_{i-1}$ of the last frame and the filter factor $(1-a)$, i.e., by averaging the present image and the last image.

In such a recursive filter, the filter factor a is changed within a range between 0 and 1. If the filter factor a approaches to 0, a weight of the last image approaches to 0 and a weight of the present image approaches to 1. Thus, the influence of the filter is decreased and it can be said that a weak filter is applied to the image. On the contrary, if the filter factor a approaches to 1, the weight of the last image approaches to 1 and the weight of the present image approaches to 0. Thus, the influence of the filter is increased and it can be said that a strong filter is applied to the image. The more the filter factor a appropriates to 1, the more the images are averaged with respect to time and the more the random noises can be reduced.

However, if an image includes an object which is moving and this motion portion of the image is applied with the strong filter having the filter factor a close to 1, the residual image of the last frame appears on the present image or the locus of the moving object appears on the present image. Therefore, the contrast of the image is lowered and the artifact is generated so that the quality of the image is degraded.

For example, in a diagnostic X-ray apparatus for displaying a fluoroscopic image obtained by radiating an X-ray to the patient, if a catheter, a guide wire, and the like are moved in a blood vessel to perform a recovery operation of a constricted portion of the blood vessel and the strong filter having the filter factor a close to 1 is applied to the image, the image of the distal end of the catheter or the guide wire will be obscured by the residual image, resulting in inconvenience in diagnosis.

In order to solve this drawback, there is provided an apparatus in which a movement of the object is detected and the recursive filter processing for every pixel is selectively performed based on the result of detection, i.e., the recursive filter processing is performed only for the still portion and is not for the motion portion. One example of such an apparatus is disclosed in Published Unexamined Japanese Utility Model Application (PUJUMA) No. 63-55400. FIG. 1 shows a block diagram of this prior art.

An image signal from an image pick-up device (not shown) is supplied to an analog-to-digital converter 1. In the case of the diagnostic X-ray apparatus, a TV camera to which a fluoroscopic X-ray image is incident from an image intensifier tube outputs the image signal. The image signal of every frame is converted to a digital image signal $X_i$. The output of the A/D converter 1 is multiplied with a factor $(1-a)$ by a multiplier 2. The filter factor a is changed within a range between 0 and 1. The output of the multiplier 2 is supplied to a first input terminal of an adder 3. A filtered output $Y_{i-1}$ of the last frame, i.e., (i-1)th frame from a frame memory 4 is supplied to a second input terminal of the adder 3 through a multiplier 5. The multiplier 5 multiplies the input signal $Y_{i-1}$ with the filter factor a.

An output of the adder 3 $(=(1-a) X_i + a \cdot Y_{i-1})$ is supplied to a first terminal I1 of a selector 6. The output of the A/D converter 1 is supplied to a second terminal I2 of the selector 6. The selector 6 selects one of the input signals I1 and I2 based on an output of a comparator 7. The comparator 7 compares the output of the A/D converter 1 with the output of the frame memory 4 for every pixel to obtain the difference between them. The selector 6 outputs the input I1 to perform the filter processing when the difference is smaller than a threshold level and the input I2 not to perform the filter processing when the difference is not smaller than the threshold level. The output of the frame memory 4 is output through a digital-to-analog converter 8 to be displayed on a monitor device (not shown).

In this conventional apparatus, the movement of the object is detected based on the difference between the pixel value of the live image $X_i$ output from the A/D converter 1 and the pixel value of the last filtered image $Y_{i-1}$ from the frame memory 4. When the movement is detected, the selector 6 is caused to select the input I2 to write the input live image $X_i$ into the frame memory without performing the filter processing. Since the filter processing is performed only for the still portion, it is possible to apply a strong filter in which the filter factor a is set to a large value, e.g., 0.8 or 0.9.

However, the filtered pixels and non-filtered pixels are adjacent to each other at the boundary between the motion portion and the still portion. This boundary markedly appears on the filtered image so that the image becomes unnatural. For example, if there is a motion portion surrounded by a still portion, the still portion is averaged and the pixel values thereof somewhat change but the motion portion is not filtered and the pixel values thereof do not change. Therefore, there is a large difference between the pixel value in the motion portion and that in the still portion, thereby giving an unnatural feeling.

In addition, the threshold value for determining whether or not the filter processing is performed is difficult to properly set. If the threshold level is set too small, the number of pixels subjected to the filter processing is decreased and the influence of filtering is reduced. Therefore, the random noises are hardly reduced. If it is set too large, the number of pixels subjected to the filter processing is increased and the influence of filtering is increased. Therefore, the motion portion is blurred.

As described, in the conventional recursive filter which selectively performs the filter processing for every pixel using the threshold value, it is not possible to satisfy the contradictory requirements of the recursive filter which are to reduce the random noises by averaging the images and to prevent the degradation of the quality of the image due to a lowering of the contrast of the image and a generation of the artifact.

SUMMARY OF THE INVENTION

Accordingly, it is an object of the present invention to provide an image processing apparatus using a recursive filter which can reduce random noises of the image without degrading the quality of the image.

According to one aspect of the present invention, there is provided an image processing apparatus comprising first recursive filter means for adding a present image and a last image with predetermined weights to output an image in which a motion portion is blurred, second recursive filter means for adding the present image and the output of the first recursive filter means with weights to output an image in which a noise is reduced, and means for determining the weights of the second recursive filter means for every pixel in accordance with a difference between a pixel value of the present image and the pixel value of the last image.

According to the image processing apparatus of the present invention, the first recursive filter means outputs a filtered image in which the motion portion is blurred and the noises are reduced. The second recursive filter means performs a strong filter processing for the still portion for reducing noises but the motion portion is not filtered. The motion portion of the present image is output from the second recursive filter means as it is and thus is not blurred.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 3 is a block diagram of the noise reducer according to the first embodiment of the present invention;

FIG. 9 shows a process in which the random noises are reduced according to the second embodiment;

FIG. 11 is a block diagram of the noise reducer according to a fourth embodiment of the present invention.

DETAILED DESCRIPTION OF THE PREFERRED EMBODIMENTS

A preferred embodiment of an image processing apparatus according to the present invention will now be described with reference to the accompanying drawings. A diagnostic X-ray apparatus is described as an embodiment of the present invention.

Figure 1:
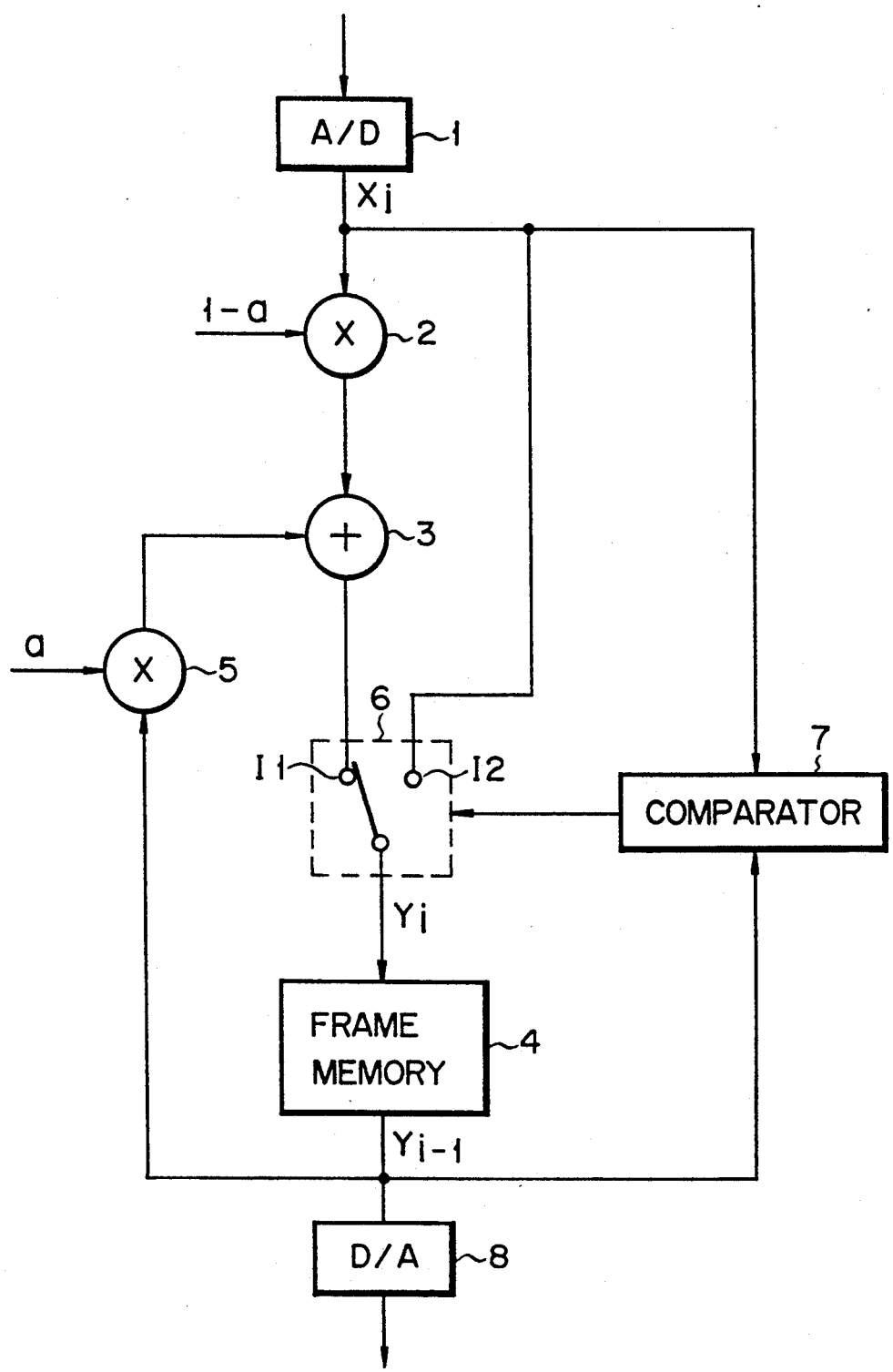
FIG. 1 is a block diagram of a conventional recursive filter.
Figure 2:
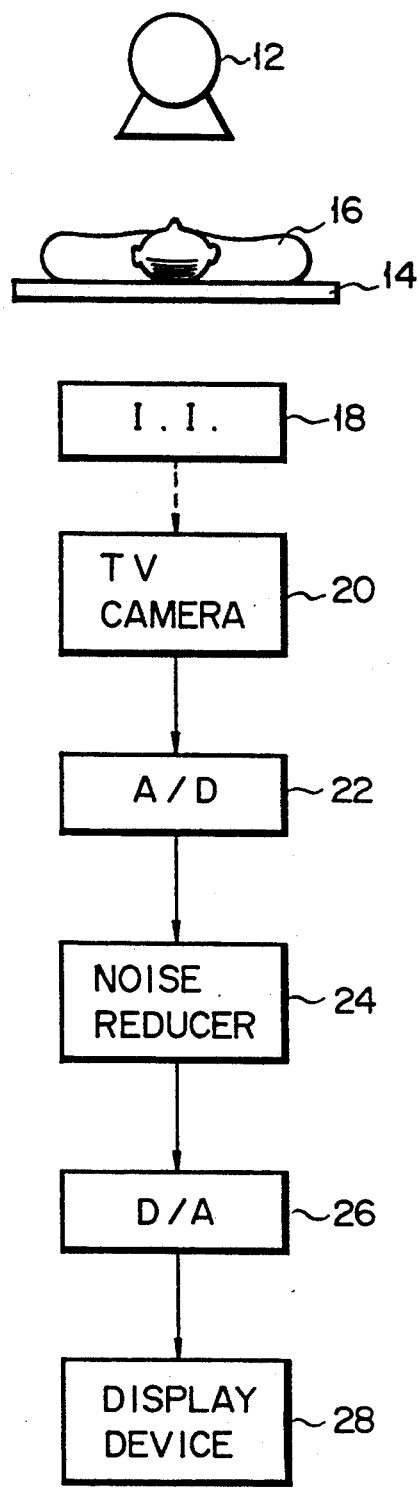
FIG. 2 is a block diagram of an overall diagnostic X-ray apparatus having a first embodiment of a noise reducer according to the present invention.

FIG. 2 is an overall block diagram of the diagnostic X-ray apparatus. An X-ray emitted from an X-ray tube 12 supported by a supporting mechanism (not shown) is incident on an image intensifier tube 18 which is also supported by the supporting mechanism through a patient 16 lying on the top plate 14 of a bed 14. Thus, a fluoroscopic image is output from the image intensifier tube 18. A TV camera 20 picks up the fluoroscopic image. An output image signal is supplied through an analog-to-digital converter 22 to a noise reducer 24 formed of a recursive filter. An output of the noise reducer 24 is supplied to a display device 28 through a digital-to-analog converter 26.

The details of the noise reducer 24 is shown in FIG. 3. The noise reducer 24 is mainly formed of two recursive filters 32 and 34, two frame memories 36 and 60, a factor table 38, and a subtracter 40. A live image signal $X_i$ of the present frame output from the A/D converter 22 is supplied to the recursive filters 32 and 34 and a first input terminal (+) of the subtracter 40.

The recursive filter 32 is formed of multipliers 42 and 44, and an adder 46. The multiplication factors of the multipliers 42 and 44 are $(1-a)$ and a. The filter factor a can be changed within a range between 0 and 1. Here, the factor a is fixed to a value close to 1. Therefore, the recursive filter 32 applies the same strong filter to all the pixels. That is, the multiplier 42 multiplies the live image $X_i$ with the factor $(1-a)$ and the multiplier 44 multiplies the output $W_{i-1}$ of the frame memory 36 with the factor a. The output of the multiplier 42 is added to the output of the multiplier 44 by the adder 52 and the output of the adder 46 is written into the frame memory 36 as a first filtered image $W_i$. An output $W_{i-1}$ of the frame memory 36 is an image of the last filtered image and is supplied to the first and second recursive filters 32 and 34.

The output $Y_i$ of the second recursive filter 34 is supplied to a frame memory 60 whose output $Y_{i-1}$ of the last frame is supplied to a second terminal (−) of the subtracter 40. The subtracter 40 subtracts the second filtered image $Y_{i-1}$ from the live image $X_i$ and supplies the difference to the factor table 38. The factor table 38 stores the factor k for the various differences as a table and supplies the factors $(1-k)$ and k to multipliers 48 and 50 of the second recursive filter 34 in response to the output from the subtracter 40.

Figure 4:
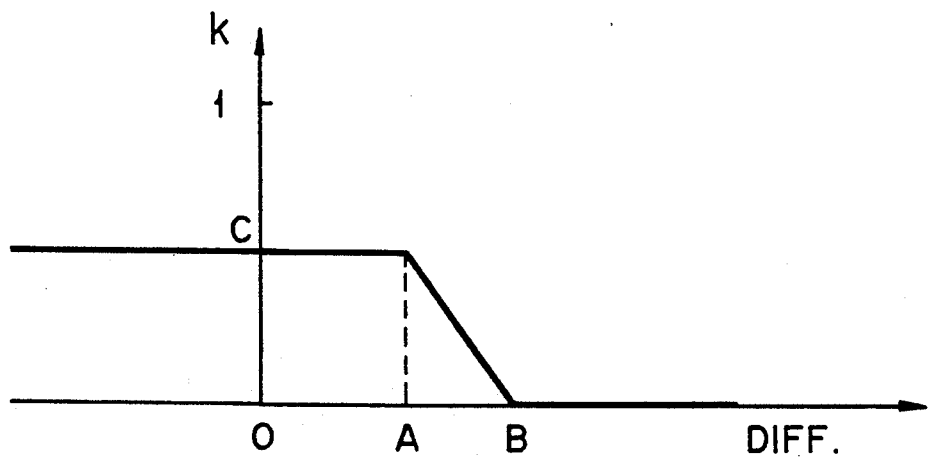
FIG. 4 shows an example of the contents of a factor table of the first embodiment.

The factor k is changed within a range between 0 and 1. The example of the factor table is shown in FIG. 4. In this example, the factor k is fixed to a given value C, e.g., 0.5 if the difference is smaller than a first predetermined value A (a positive value), fixed to 0 if the difference is larger than a second predetermined value B which is larger than the value A, and gradually decreased from 0.5 to 0 if the difference is within the range between the values A and B. Therefore, the still portion having the small difference and a portion which is included in the last image but not in the present image are strongly filtered in which the present image and the last image are averaged, thereby reducing the noises of the still portion and the portion which is included in the last image but not in the present image. On the contrary, the motion portion in the present image is subjected to the filter processing of a grade according to the degree of the movement, i.e., the less strong filter processing is applied to the more motion portion.

Figure 5:
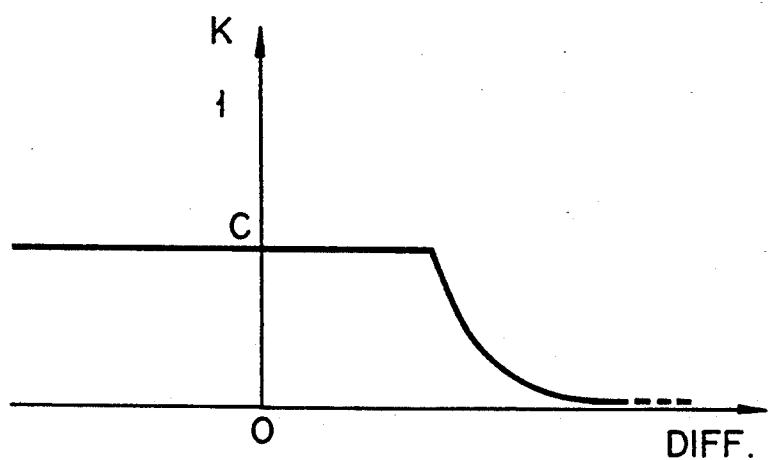
FIG. 5 shows another example of the contents of the factor table of the first embodiment.
Figure 6:
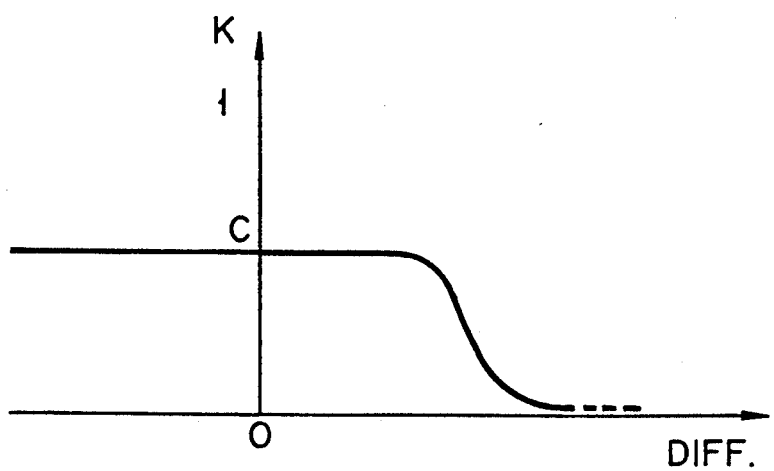
FIG. 6 shows a still another example of the contents of a factor table of the first embodiment.

It is possible to modify the contents of the factor table as shown in FIGS. 5 and 6. In FIG. 5, the factor k is changed like a quadratic curve near the upper threshold value B. The influence of the filter is more gradually reduced near the upper threshold value B so that the unnatural feeling of the image in the portion having the difference of the upper threshold value B. In FIG. 6, the factor k is changed like a quadratic curve near both the lower and the upper threshold values A and B. The influence of the filter is more gradually reduced near both the lower and the upper threshold values A and B so that the unnatural feeling of the image in the portions having the differences of the lower and the upper threshold values A and B.

In the second recursive filter 34, the multiplier 48 multiplies the live image $X_i$ of the present frame with the factor $(1-k)$ and the multiplier 50 multiplies the second filtered image $W_{i-1}$ of the last frame output from the frame memory 36 with the factor k. The output of the multiplier 48 is added to the output of the multiplier 50 by the adder 52 and the output of the adder 52 is output to the D/A converter 26 as the noise reduced image $Y_i$ and is written into the frame memory 60.

The operation of the first embodiment will be described. A motion image signal of thirty frames per one second output from the TV camera 20 is supplied to the noise reducer 24 through the A/D converter 22. In the noise reducer 24, the first recursive filter 32 outputs the following filtered image $W_i$.

$$W_i = (1-a) \cdot X_i + a \cdot W_{i-1} \quad (2)$$

As described above, the factor a is set to near 1 so that the output $W_i$ of the first filter 32 has been subjected to the strong filter processing. In the filtered image $W_i$, the random noises are reduced but the motion portion is blurred. The second recursive filter 34 outputs the following filtered image $Y_i$.

$$Y_i = (1-k) \cdot X_i + k \cdot W_{i-1} \quad (3)$$

As described above, the factor k for every pixel is a variable in accordance with the difference output from the subtracter 40 and is set to 0.1 to 0 if the large movement is detected. If the factor k is set to these small values, it can be regarded that the filter is not applied to the image since the influence of the last image output from the first recursive filter 32 does not appear on the present image. In this case, though the random noises are not reduced, it is prevented that the image of the motion portion is blurred due to the strong filtering processing. If the movement is hardly detected, the factor k is set to a large value, for example, 0.5. If the factor k is set to the large value, the last image and the present image are averaged and the random noises can be reduced.

Figure 7:
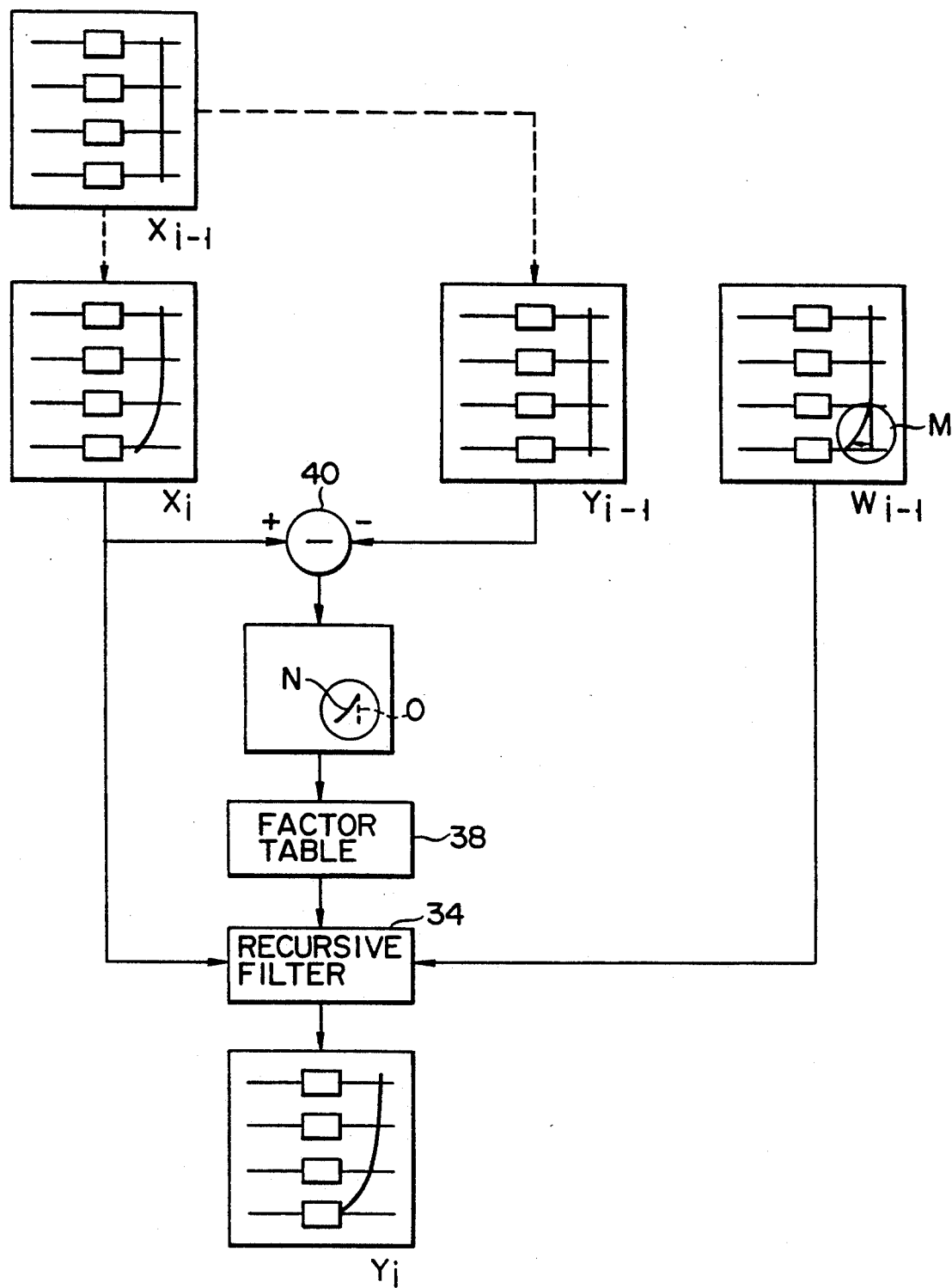
FIG. 7 shows a process in which the random noises are reduced according to the first embodiment.

A process in which the random noises are reduced according to the present embodiment is described with reference to FIG. 7. FIG. 7 shows the change of the fluoroscopic image caused by the insertion of the catheter during the recovery operation of a constricted portion of the blood vessel.

The first recursive filter 32 performs a strong filter processing and the first filtered image $W_{i-1}$ is output. In the first filtered image $W_{i-1}$, the random noises are reduced and the motion portion (encircled portion M in FIG. 7) is blurred. The motion portion M includes a new image N which is included in the present image but is not in the last image and an old image O which is included in the last image but is not in the present image. The subtracter 40 detects the motion portion M by subtracting the filtered image $Y_{i-1}$ of the last frame from the line image $X_i$ of the present frame. Therefore, the new image N has a positive value and the old image O has a negative value. The factor table produces the factor k having a large value to perform a strong filter processing for the old image O and a still portion other than the portion M and the factor k having a small value not to perform a filter processing for the new image N. The random noises for the old image O is greatly reduced compared to the case in which the present image is output as it is. As a result, the random noises for the still portion are greatly reduced and the motion portion is not blurred in the filtered image $Y_i$.

According to the present embodiment, only the new image in the motion portion is output as it is and the other portion is strongly filtered in the second recursive filter 34 so that the random noises in the still portion are greatly reduced and the blurring of the motion portion is prevented.

Figure 8:
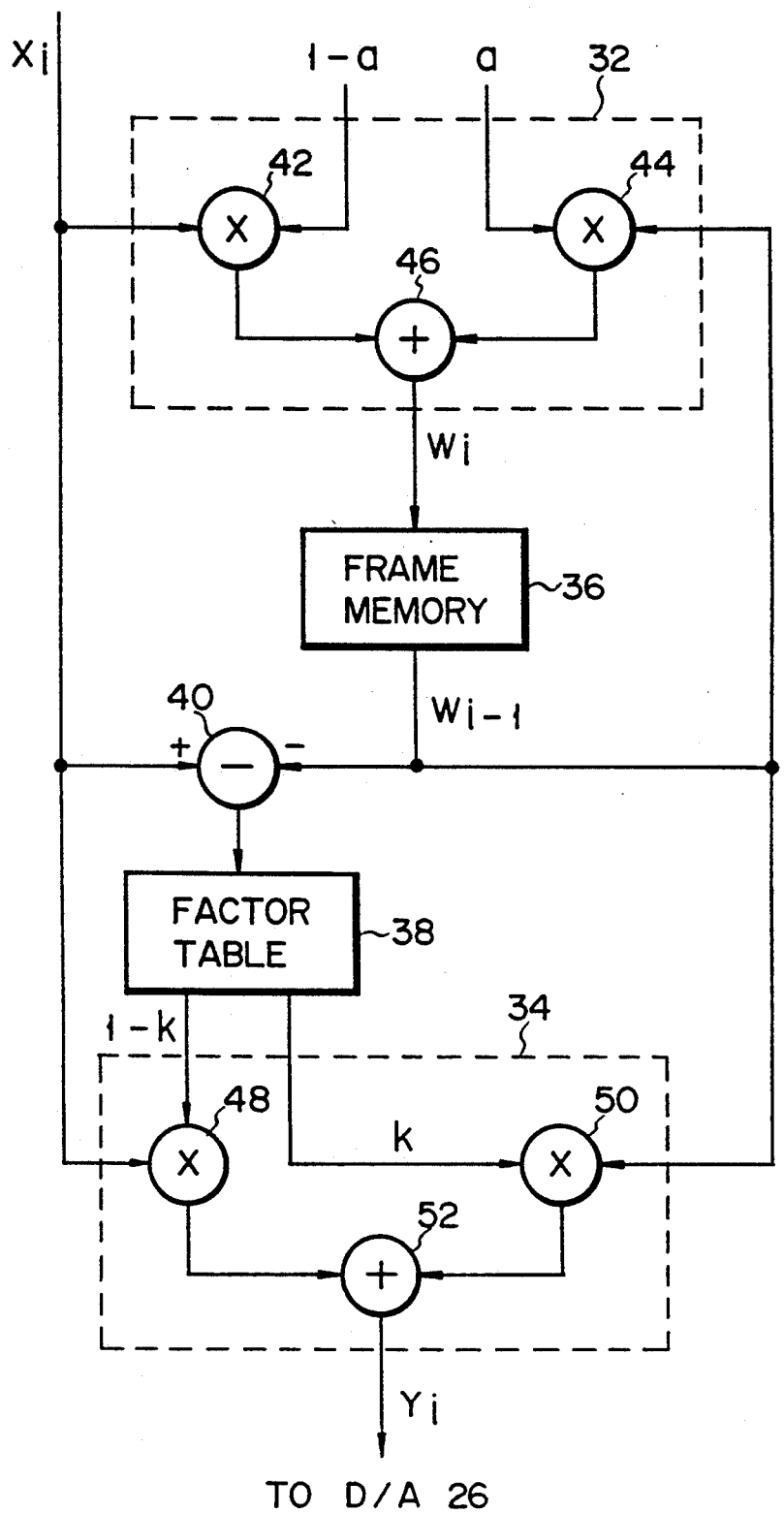
FIG. 8 is a block diagram of the noise reducer according to a second embodiment of the present invention.

Other embodiments of the present invention will be described below. FIG. 8 is a block diagram of a second embodiment. The second embodiment differs from the first embodiment only in that the subtracter 40 obtains the difference between the live image $X_i$ and the first filtered image $W_{i-1}$. In the first embodiment, a preferable result is obtained for a moving object such as a heart. However, a following drawback is predicted for the still portion such as a head. In the image of the head, only the image of the catheter or the guide wire is moved It is assumed that the catheter starts moving at (i-1)th frame and is moved linearly as shown in FIG. 9. There is no trouble up to the calculation of $Y_i$. In the calculation of $Y_{i+1}$, the subtracter 40 detects a motion portion M1. However, there is a still portion S1 of only the upper quarter in the first filtered image $W_i$. The motion portion M1 is separated from the still portion S1 in the second filtered image $Y_{i+1}$ since the portion between the motion portion M1 and the still portion S1 is mostly affected by the first filtered image $W_i$. If the motion portion is detected by the subtracter 40 based on the difference between the live image $X_i$ and the first filtered image $W_{i-1}$, as shown in FIG. 8, it is possible to overcome this drawback. Therefore, it is desirable to use the first embodiment for the motion object such as a heart and the second embodiment for the still object such as a head.

Figure 10:
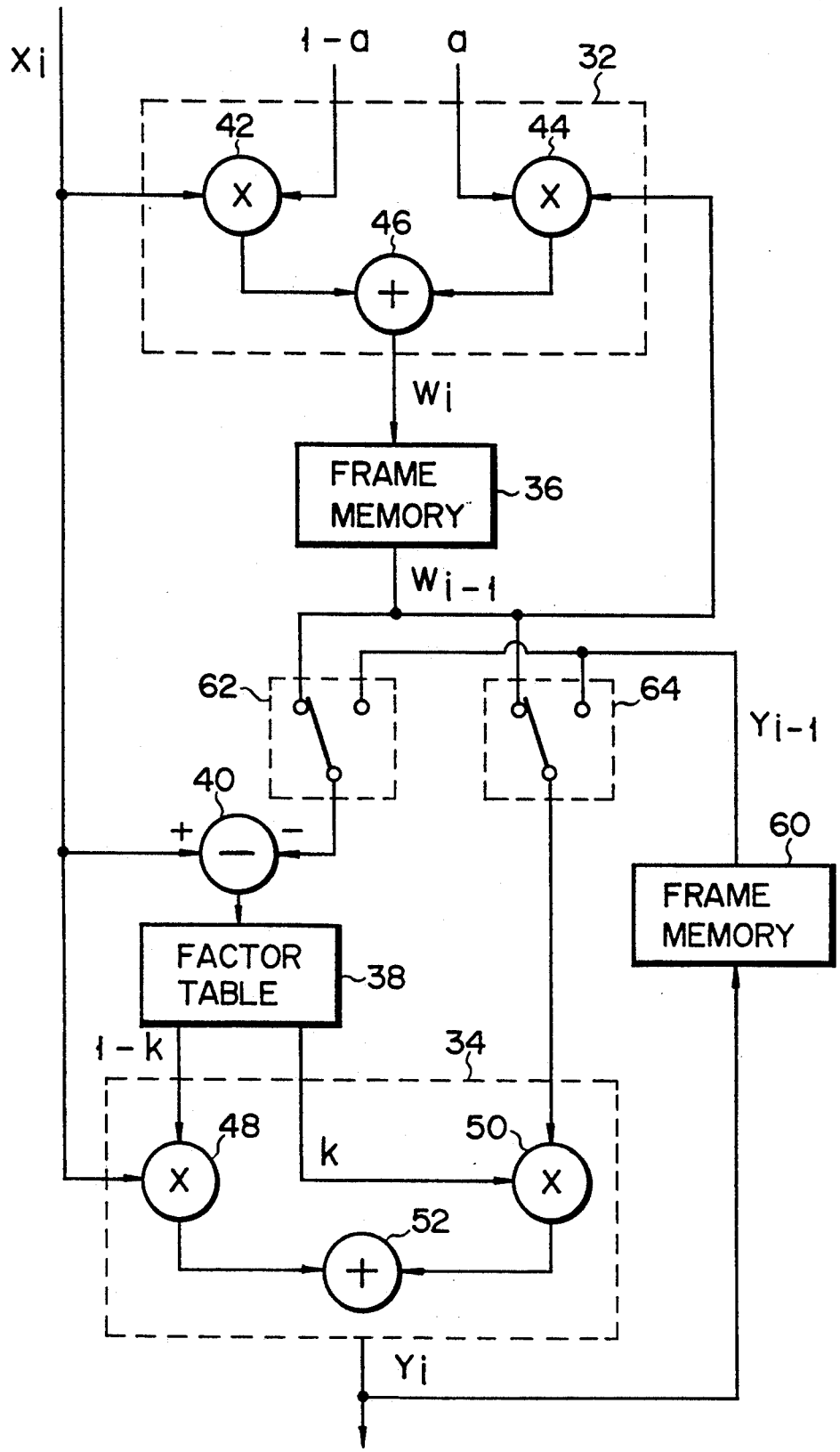
FIG. 10 is a block diagram of the noise reducer according to a third embodiment of the present invention.

FIG. 10 is a block diagram of a third embodiment of the present invention. The third embodiment is a combination of the first and second embodiments using selectors 62 and 64. One of the output of the frame memory 36 and the output of the frame memory 60 is selected by the selector 62 and selected image is supplied to the subtracter 38. The selector 62 is manually switched and is caused to select the output of the frame memory 36 for the head and to select the output of the frame memory 60 for the heart.

Further, one of the output of the frame memory 36 and the output of the frame memory 60 is selected by the selector 64 and selected image is supplied to the multiplier 50 of the recursive filter 34. The selector 64 is manually switched independent of the selector 62.

FIG. 11 is a block diagram of a fourth embodiment of the present invention. The fourth embodiment is an improvement of the third embodiment to which low-pass filters 66 and 68 are added. The low-pass filters 66 and 68 are connected to the input terminals of the subtracter 40. The live image $X_i$ is supplied to the subtracter 40 through the low-pass filter 66 and the output of the selector 62 is supplied to the subtracter 40 through the low-pass filter 68. The low-pass filters 66 and 68 smooths the images so that the accuracy of the motion detection is improved since the present image and the last image are compared to each other after the noises are reduced. It is possible to omit the low-pass filter 68 for the last image since the last image has already passed the recursive filters 32 or 34.

As has been described above, according to the present invention, since the motion portion is blurred and the random noise is reduced by the first filter, the new image which is included in the present image but is not in the last image is not filtered by the second filter, and only the still portion is strongly filtered by the second filter, it is possible to provide an image processing apparatus using a recursive filter which can reduce random noises of the image without degrading the quality of the image.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, the present invention is not limited to use for processing medical images but can be applied to use for processing any type of image, wherein an effective result is obtained.

What is claimed is:

1. An image processing apparatus comprising:
   first recursive filter means for adding a present image and a last image with predetermined weights to output an image in which a motion portion is blurred;
   second recursive filter means for adding the present image and the output of said first recursive filter means with weights to output an image in which a noise is reduced; and
   means for determining the weights of said second recursive filter means for every pixel in accordance with a difference between a pixel value of the present image and the pixel value of the last image.

2. An apparatus according to claim 1, wherein said weight determining means comprises means for determining the weights of said second recursive filter means in accordance with a difference between a pixel value of the present image and the pixel value of the output of said first recursive filter means.

3. An apparatus according to claim 1, wherein said weight determining means comprises means for determining the weights of said second recursive filter means in accordance with a difference between a pixel value of the present image and the pixel value of the output of said second recursive filter means.

4. An apparatus according to claim 1, wherein said weight determining means comprises means for selecting one of the outputs from said first recursive filter means and said second recursive filter means and means for determining the weights of said second recursive filter means in accordance with a difference between a pixel value of the present image and the pixel value of the image output from said selecting means.

5. An apparatus according to claim 1, wherein said weight determining means comprises means for setting the weight of said second recursive filter means for the present image to a large value if the difference has a positive large value and a negative value and the weight of said second recursive filter means for the output of said first recursive filter means to a large value if the difference has a positive small value.

6. An apparatus according to claim 1, wherein said weight determining means comprises a first low-pass filter for smoothing the present image and compares the present image output from said first low-pass filter and the last image to produce a difference.

7. An apparatus according to claim 6, wherein said weight determining means further comprises a second low-pass filter for smoothing the last image and compares the present image output from said first low-pass filter and the last image output from said second low-pass filter to produce a difference.

8. An apparatus according to claim 1, wherein said first recursive filter means adds the present image and the last image with the same weight.

9. An apparatus according to claim 1, wherein said second recursive filter means comprises means for selecting one of the outputs of said first recursive filter means and said second recursive filter means and means for adding the present image and the output of said selector means with weights to reduce the noise in the present image.

10. A diagnostic X-ray apparatus comprising:
    fluoroscopy means for outputting a fluoroscopic image signal by picking up a fluoroscopic image obtained by radiating an X-ray to an object;
    first recursive filter means including a frame memory, for adding an output of said fluoroscopy means and an output of said frame memory with predetermined weights to write the result of addition into said frame memory;
    subtracter means for subtracting the output of said frame memory from the output of said fluoroscopy means for every pixel;
    means for generating a factor k in accordance with the difference obtained by said subtracter means, the factor k and the difference having an inverse proportional relationship if the difference has a positive value; and
    second recursive filter means for adding a value which is $(1-k)$ times the output of said fluoroscopy means and a value which is k times the output of said first recursive filter means.

11. An apparatus according to claim 10, wherein said factor generating means generates the factor k having a given value when the difference is smaller than a first positive predetermined value, the factor k having a value of 0 when the difference is larger than a second positive predetermined value which is larger than the first predetermined value, and the factor k having a value gradually decreasing from the given value to 0 when the difference is within a range between the first and second predetermined values.

12. An apparatus according to claim 11, wherein the factor k has a value which is linearly decreased from the given value to 0 when the difference is within the range between the first and second predetermined values.

13. An apparatus according to claim 11, wherein the factor k has a value which is decreased in a quadratic curve manner from 0.5 to 0 when the difference is within the range between the first and second predetermined values.

14. A diagnostic X-ray apparatus comprising:
fluoroscopy means for outputting a fluoroscopic image signal by picking up a fluoroscopic image obtained by radiating an X-ray to an object;
first recursive filter means including a frame memory, for adding an output of said fluoroscopy means and an output of said frame memory with predetermined weights to write the result of addition into said frame memory;
second recursive filter means for adding a value which is $(1-k)$ times the output of said fluoroscopy means and a value which is k times the output of said first recursive filter means, a factor k being a positive number between 0 and 1;

subtracter means for subtracting the output of said second recursive filter means from the output of said fluoroscopy means for every pixel; and
means for setting the factor k in accordance with the difference obtained by said subtracter means, the factor k and the difference having an inverse proportional relationship if the difference has a positive value.

15. An apparatus according to claim 14, wherein said factor setting means sets the factor k having a given value when the difference is smaller than a first positive predetermined value, the factor k having a value of 0 when the difference is larger than a second positive predetermined value which is larger than the first predetermined value, and the factor k having a value gradually decreasing from the given value to 0 when the difference is within a range between the first and second predetermined values.

16. An apparatus according to claim 15, wherein the factor k has a value which is linearly decreased from the given value to 0 when the difference is within the range between the first and second predetermined values.

17. An apparatus according to claim 15, wherein the factor k has a value which is decreased in a quadratic curve manner from the given value to 0 when the difference is within the range between the first and second predetermined values.

* * * * *